US009673022B2

(12) United States Patent
Greenberg et al.

(10) Patent No.: US 9,673,022 B2
(45) Date of Patent: Jun. 6, 2017

(54) REVIEW OF SUSPECTED DEFECTS USING ONE OR MORE REFERENCE DIES

(71) Applicant: APPLIED MATERIALS ISRAEL LTD., Rehovot (IL)

(72) Inventors: Ofir Greenberg, Haniel (IL); Yuval Gronau, Ramat Hasharon (IL)

(73) Assignee: APPLIED MATERIALS ISRAEL LTD., Rehovot (IL)

( * ) Notice: Subject to any disclaimer, the term of this patent is extended or adjusted under 35 U.S.C. 154(b) by 0 days.

(21) Appl. No.: 14/798,153

(22) Filed: Jul. 13, 2015

(65) Prior Publication Data
US 2017/0018398 A1   Jan. 19, 2017

(51) Int. Cl.
  *G01N 21/88*   (2006.01)
  *H01J 37/22*   (2006.01)
  *H01J 37/28*   (2006.01)

(52) U.S. Cl.
  CPC ............ *H01J 37/222* (2013.01); *H01J 37/28* (2013.01); *H01J 2237/2813* (2013.01)

(58) Field of Classification Search
  CPC ..... G06T 7/001; G06T 7/0004; G06T 7/0006; G06T 7/0008; G06T 7/0002; G06T 7/0028; G06T 7/004; G01N 21/95607; G01N 21/9501; G01N 21/93; G01N 21/8803; G01N 21/8806; G01N 21/8851; H01L 21/67005; H01L 21/67288; H01L 21/67242; H01L 21/67271; H01L 22/20; H01L 22/24

USPC ....... 382/145, 144, 149, 147, 103, 141, 148, 382/146, 150, 151, 181; 250/306, 307, 250/310, 311, 492.2, 559.39, 559.45
  See application file for complete search history.

(56) References Cited

U.S. PATENT DOCUMENTS

| | | | | |
|---|---|---|---|---|
| 7,345,753 | B2 * | 3/2008 | Bhaskar | G06T 7/0004 250/559.45 |
| 7,355,693 | B2 * | 4/2008 | Takeda | G01N 21/95607 356/237.1 |
| 7,570,796 | B2 * | 8/2009 | Zafar | G03F 1/84 382/144 |
| 7,598,490 | B2 * | 10/2009 | Kurihara | G01N 21/9501 250/306 |

(Continued)

Primary Examiner — David A Vanore
(74) Attorney, Agent, or Firm — Kilpatrick Townsend & Stockton LLP

(57) ABSTRACT

A system for reviewing a wafer, the system may include a memory unit that is configured to store information about locations of a set of suspected defects that are located at multiple dice of the wafer; electron optics that is configured to obtain images of reference elements, wherein the reference elements are located within a first reference die of the wafer; and a processor that is configured to: compare the first sub-set of suspected defects to a first sub-set of reference elements to provide a first evaluation result; and select, in response to the first evaluation result, a source of a second sub-set of reference elements. The electron optics is further configured to obtain images of a second sub-set of reference elements that are located within a second reference die of the wafer when it is determined that the second reference die is the source of the second sub-set of reference elements. The processor is further configured to compare the second sub-set of suspected defects to the second sub-set of reference elements to provide a second evaluation result.

15 Claims, 6 Drawing Sheets

(56) References Cited

U.S. PATENT DOCUMENTS

| | | | | |
|---|---|---|---|---|
| 7,676,077 | B2* | 3/2010 | Kulkarni | G06F 17/5045 382/144 |
| 7,729,528 | B2* | 6/2010 | O'Dell | G01N 21/9501 250/559.39 |
| 7,729,529 | B2* | 6/2010 | Wu | G01N 21/95607 382/144 |
| 7,796,804 | B2* | 9/2010 | Bhaskar | G01N 21/93 382/103 |
| 8,041,103 | B2* | 10/2011 | Kulkarni | G06F 17/5045 382/144 |
| 8,139,843 | B2* | 3/2012 | Kulkarni | G06F 17/5045 382/144 |
| 8,204,296 | B2* | 6/2012 | Bhaskar | G01N 21/93 382/103 |
| 8,355,559 | B2* | 1/2013 | Harada | G06T 7/001 382/141 |
| 8,841,933 | B2* | 9/2014 | Patterson | G06T 7/0004 324/762.05 |
| 8,923,600 | B2* | 12/2014 | Zafar | G03F 1/84 382/144 |
| 9,070,014 | B2* | 6/2015 | Amzaleg | G06K 9/00536 |
| 9,401,014 | B2* | 7/2016 | Zafar | G03F 1/84 |
| 9,490,101 | B2* | 11/2016 | Gronau | H01J 37/222 |
| 2011/0286656 | A1* | 11/2011 | Kulkarni | H01L 21/67005 382/144 |
| 2014/0233838 | A1* | 8/2014 | Amzaleg | G06T 7/001 382/141 |
| 2016/0190020 | A1* | 6/2016 | Kimura | G01R 31/265 438/16 |

* cited by examiner

REVIEW OF SUSPECTED DEFECTS USING ONE OR MORE REFERENCE DIES

BACKGROUND OF THE INVENTION

Objects such as wafers are manufactured by highly complicated manufacturing processes. These manufacturing processes should be monitored in order to ensure the quality of the wafers.

The monitoring process may include a first phase of an optical, ultraviolet, deep ultraviolet or extreme ultraviolet inspection to detect suspected defects and a second phase of defect review.

Defect review is usually executed by a scanning electron microscope (SEM) that exhibits a very high resolution (nanometric order).

The field of view of the SEM is relatively small and does not include the entire wafer. A review of suspected effects of a wafer requires an introduction of mechanical movements between the wafer and electron optics of the SEM as well as scans of the suspected defects with an electron beam. Each mechanical movement may be followed by a navigation process for navigating toward a suspected defect. Both the mechanical movement and the navigation process are time consuming.

There is a growing need to accelerate the defect review.

BRIEF SUMMARY OF THE INVENTION

According to an embodiment of the invention there may be provided a system for reviewing a wafer, the system may include (i) a memory unit that is configured to store information about locations of a set of suspected defects that are located at multiple dice of the wafer; (ii) electron optics that is configured to obtain images of reference elements, wherein the reference elements are located within a first reference die of the wafer; (iii) a processor that is configured to compare a first sub-set of suspected defects to a first sub-set of reference elements to provide a first evaluation result; and select, in response to the first evaluation result, a source of a second sub-set of reference elements. The electron optics is further configured to obtain images of a second sub-set of reference elements that are located within a second reference die of the wafer when it is determined that the second reference die is the source of the second sub-set of reference elements. The processor is further configured to compare a second sub-set of suspected defects to the second sub-set of reference elements to provide a second evaluation result.

According to an embodiment of the invention there may be provided a method for reviewing a wafer, the method may include receiving information about locations of a set of suspected defects that are located at multiple dice of the wafer; obtaining images of reference elements, wherein the reference elements are located within a first reference die of the wafer; obtaining images of a first sub-set of suspected defects; comparing the first sub-set of suspected defects to a first sub-set of reference elements to provide a first evaluation result; selecting, in response to the first evaluation result, a source of a second sub-set of reference elements; obtaining images of a second sub-set of reference elements that are located within a second reference die of the wafer when it is determined that the second reference die is the source of the second sub-set of reference elements; obtaining images of a second sub-set of suspected defects; and comparing the second sub-set of suspected defects to the second sub-set of reference elements to provide a second evaluation result.

The method may include retrieving images of the second sub-set of reference elements from the images of the reference elements that are located within the first reference die of the wafer when it is determined that the first reference die is the source of the second sub-set of reference elements.

The method may include selecting first reference die as the source of the second sub-set of reference elements if the first evaluation result is indicative of a mismatch between the first sub-set of suspected defects and the first sub-set of reference elements; and wherein the mismatch exceeds a mismatch threshold.

The first evaluation result may include a classification of the first sub-set of suspected defects; and wherein the selecting of the source is responsive to the classification of the first sub-set of suspected defects.

The second sub-set of suspected defects may belong to dice that are positioned at a same distance from the first reference die.

The first sub-set of suspected defects may include a predetermined number of suspected defects.

The method may include determining a spatial distribution of the first sub-set of suspected defects in response to an actual or expected level of process variation.

According to an embodiment of the invention there may be provided a non-transitory computer readable medium that may store instructions that once executed by a computer cause the computer to receive information about locations of a set of suspected defects that are located at multiple dice of a wafer; obtain images of reference elements, wherein the reference elements are located within a first reference die of the wafer;

obtain images of a first sub-set of suspected defects; compare the first sub-set of suspected defects to a first sub-set of reference elements to provide a first evaluation result; select, in response to the first evaluation result, a source of a second sub-set of reference elements; obtain images of a second sub-set of reference elements that are located within a second reference die of the wafer when it is determined that the second reference die is the source of the second sub-set of reference elements; obtain images of a second sub-set of suspected defects; and compare the second sub-set of suspected defects to the second sub-set of reference elements to provide a second evaluation result.

According to an embodiment of the invention there may be provided a method for reviewing a wafer, the method may include receiving or selecting a set of reference dice of a wafer, wherein the set of reference dice is selected in response to at least one out of: process variations associated with the wafer; deviations between review results related to different dice of a group of dice of the wafer; locations of the dice of the group of dice; and timing constraints associated with reviewing of suspected defects that are located in a group of dice of the wafer; and reviewing the suspected defects using reference images obtained from the set of reference dice; and wherein the set of reference dice may include fewer dice than the group of dice.

The set of reference dice may have a single reference die.

The method may include selecting the reference dice of the set of reference dice.

The method may include selecting the reference dice to minimize a duration of the reviewing of the suspected defects while maintaining at least a predefined quality level of the reviewing of the suspected defects.

According to an embodiment of the invention there may be provided a non-transitory computer readable medium that stores instructions that once executed by a computer cause the computer to receive or select a set of reference dice of a wafer, wherein the set of reference dice is selected in response to at least one out of: process variations associated with the wafer; deviations between review results related to different dice of a group of dice of the wafer; locations of the dice of the group of dice; and timing constraints associated with reviewing of suspected defects that are located in a group of dice of the wafer; and reviewing the suspected defects using reference images obtained from the set of reference dice; and wherein the set of reference dice may include fewer dice than the group of dice.

According to an embodiment of the invention there may be provided a system for reviewing a wafer, the system may include (i) a processor that is configured receive or select a set of reference dice of a wafer, wherein the set of reference dice is selected in response to at least one out of: process variations associated with the wafer; deviations between review results related to different dice of a group of dice of the wafer; locations of the dice of the group of dice; and timing constraints associated with reviewing of suspected defects that are located in a group of dice of the wafer; and (ii) electron optics that is configured to obtain reference images obtained from the set of reference dice; wherein the processor is further configured to review the suspected defects using the reference images obtained from the set of reference dice; and wherein the set of reference dice may include fewer dice than the group of dice.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
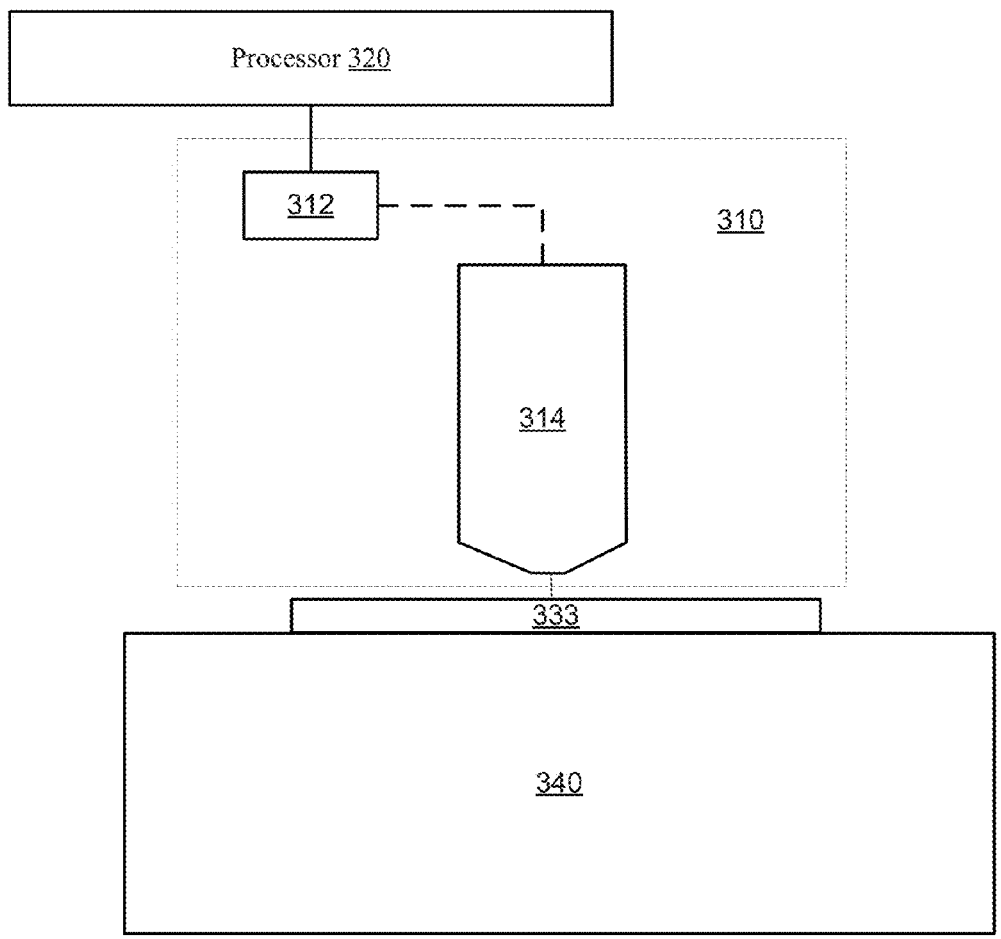
FIG. 1 illustrates a system according to an embodiment of the invention.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings.

Because the illustrated embodiments of the present invention may for the most part, be implemented using electronic components and circuits known to those skilled in the art, details will not be explained in any greater extent than that considered necessary as illustrated above, for the understanding and appreciation of the underlying concepts of the present invention and in order not to obfuscate or distract from the teachings of the present invention.

Any reference in the specification to a method should be applied mutatis mutandis to a system capable of executing the method and should be applied mutatis mutandis to a non-transitory computer readable medium that stores instructions that once executed by a computer result in the execution of the method.

Any reference in the specification to a system should be applied mutatis mutandis to a method that may be executed by the system and should be applied mutatis mutandis to a non-transitory computer readable medium that stores instructions that may be executed by the system.

Any reference in the specification to a non-transitory computer readable medium should be applied mutatis mutandis to a system capable of executing the instructions stored in the non-transitory computer readable medium and should be applied mutatis mutandis to method that may be executed by a computer that reads the instructions stored in the non-transitory computer readable medium.

FIG. 1 illustrates system 300 according to an embodiment of the invention.

FIG. 1 illustrates system 300 as being a charged particles imager such as but not limited to a scanning electron microscope (SEM) or an electron beam inspection (EBI) system.

System 300 includes an image obtaining module 310, a processor 320 and a mechanical stage 340 for supporting and moving an object such as wafer 333.

The object may differ from a wafer but for simplicity of explanation it is assumed that the object is a wafer.

Image obtaining module 310 may include a controller 312 and charged particles optics 314. The charged particles optics 314 is arranged to illuminate suspected defects and reference elements of wafer 333.

System 300 receives information about suspected defects that should be reviewed. The information includes, at least, the coordinates of the suspected defects.

System 300 obtains images of reference elements that are presumed to be defect free and compares each reference element to a corresponding suspected defect.

A reference element should be located at the same location (within a die) as the corresponding suspected defect.

The selection of which reference elements provides a tradeoff between the speed of the review process and the accuracy of the review process.

A first tradeoff selects, for each die of the wafer, reference elements from a neighboring die. This first tradeoff may select the neighboring die out of multiple neighboring dies in order to result in a shorter stage movement. The selection can include selecting the neighboring die located at an orientation of the shorter dimension of the die pitch.

The first tradeoff resulted in a time consuming review process that required many unnecessary mechanical movements.

Assuming that there was a first number (N1) of dice that include suspected defects—then the review process has to image suspected defects in N1 dice and to image reference elements in N1 neighboring dice.

Figure 2:
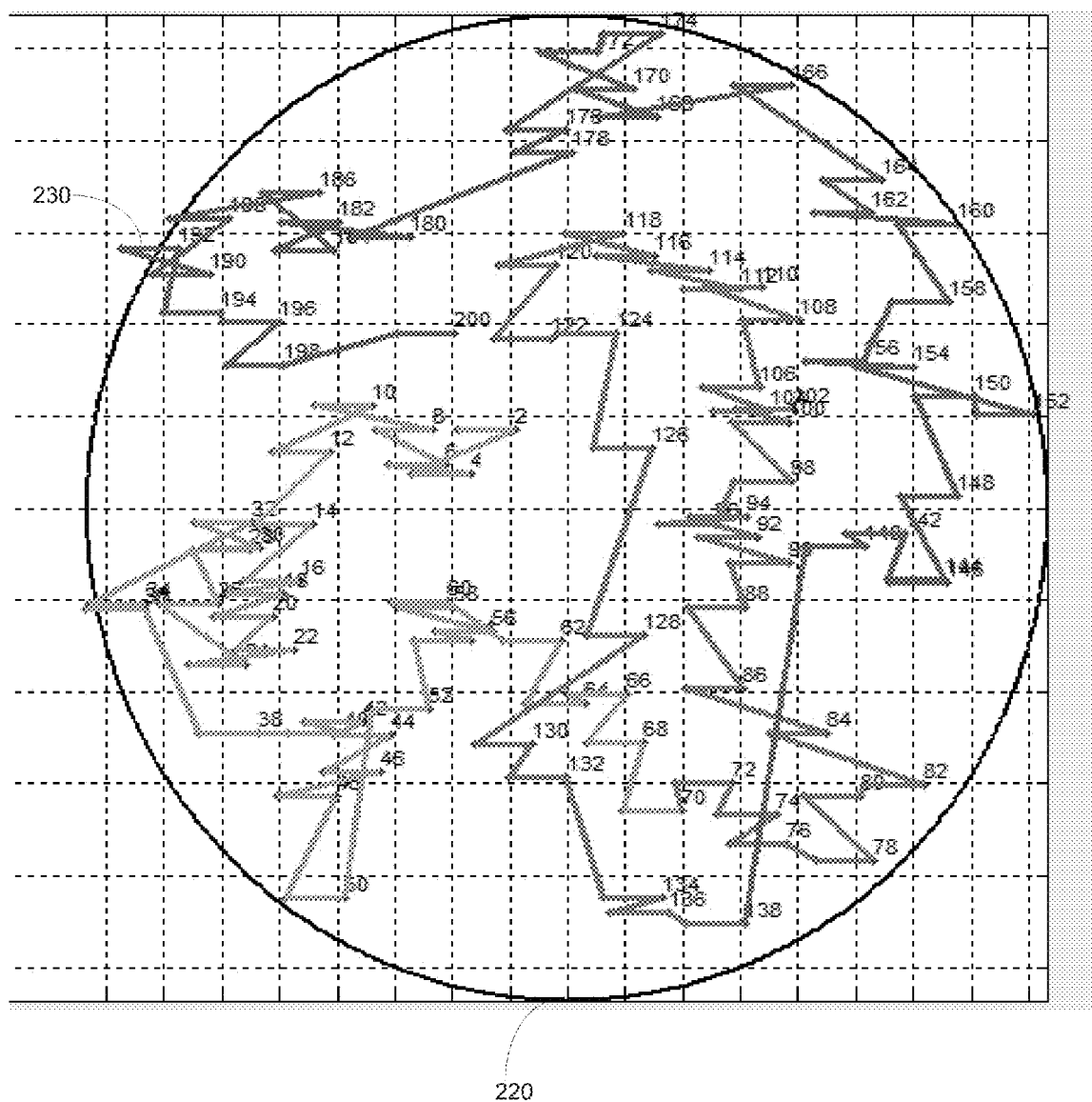
FIG. 2 illustrates a wafer and a scan pattern.

FIG. 2 illustrates wafer 220 and a scan pattern 230 that includes one hundred and ninety nine mechanical movements between two hundred stops (denoted 1-200). About one half of the mechanical movements are for reaching suspected defects and about one half of the mechanical movements are for reaching the reference images.

A second tradeoff starts by selecting reference elements from a first reference die.

The selection of the first reference die (as a source of reference elements) is evaluated during the review process so that if the first reference die stops to provide reliable reference elements—system 300 selects another reference die and reference elements are taken from the other reference die.

The review process proceeds and the other reference die is evaluated. The other reference die may be replaced (As a source of reference elements) by a newer reference die.

The wafer may be subjected to process variations that induce differences between ideally identical elements of the wafer. These differences may cause a reference element to be reliable for one die and to be unreliable for another die.

Figure 3:
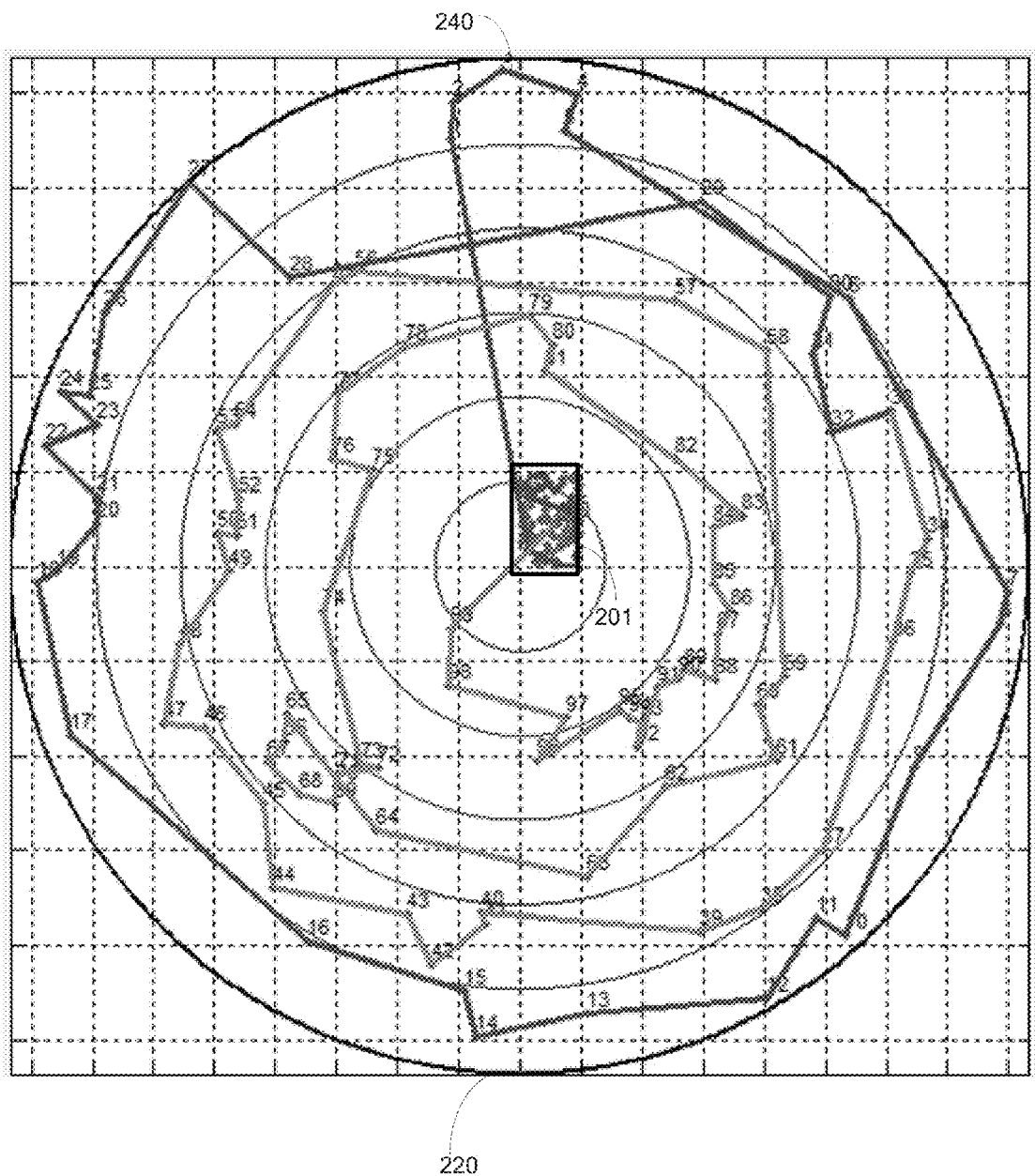
FIG. 3 illustrates a wafer and a scan pattern according to an embodiment of the invention.

For example, a reference element may be taken from first reference die 201 of FIG. 3. The first reference die 201 is positioned at the center of the wafer 220. The reference element may be relevant for all dice (as illustrated in FIG. 3) but may stop being relevant for dice that are distant from the center of the wafer (as illustrated by the selection of second reference die 202 and third reference die in FIG. 4).

The evaluation of any source of reference elements may be evaluated by analyzing the comparison results between suspected defects and reference elements from the source of reference elements.

The selection of a reference die can be done in advance, deterministically—before starting the review. The selection can involve limiting a distance between a reference die and clustering the defect map so the reference dies choice is optimized.

When a source stops to provide reliable reference elements the percent of suspected defects that are declared as actual defects increases.

In most cases the second tradeoff dramatically increases the speed of the review process as the acquisition of reference element is limited to reference elements within one reference die or few reference dice.

FIG. 3 illustrates wafer 220 and a scan pattern 240 that includes ninety nine movements between one hundred stops (denoted 1-100) that represent suspected defects that belong to multiple dice as well as one hundred mechanical movements within first reference die 201—for obtaining the one hundred reference elements.

Figure 4:
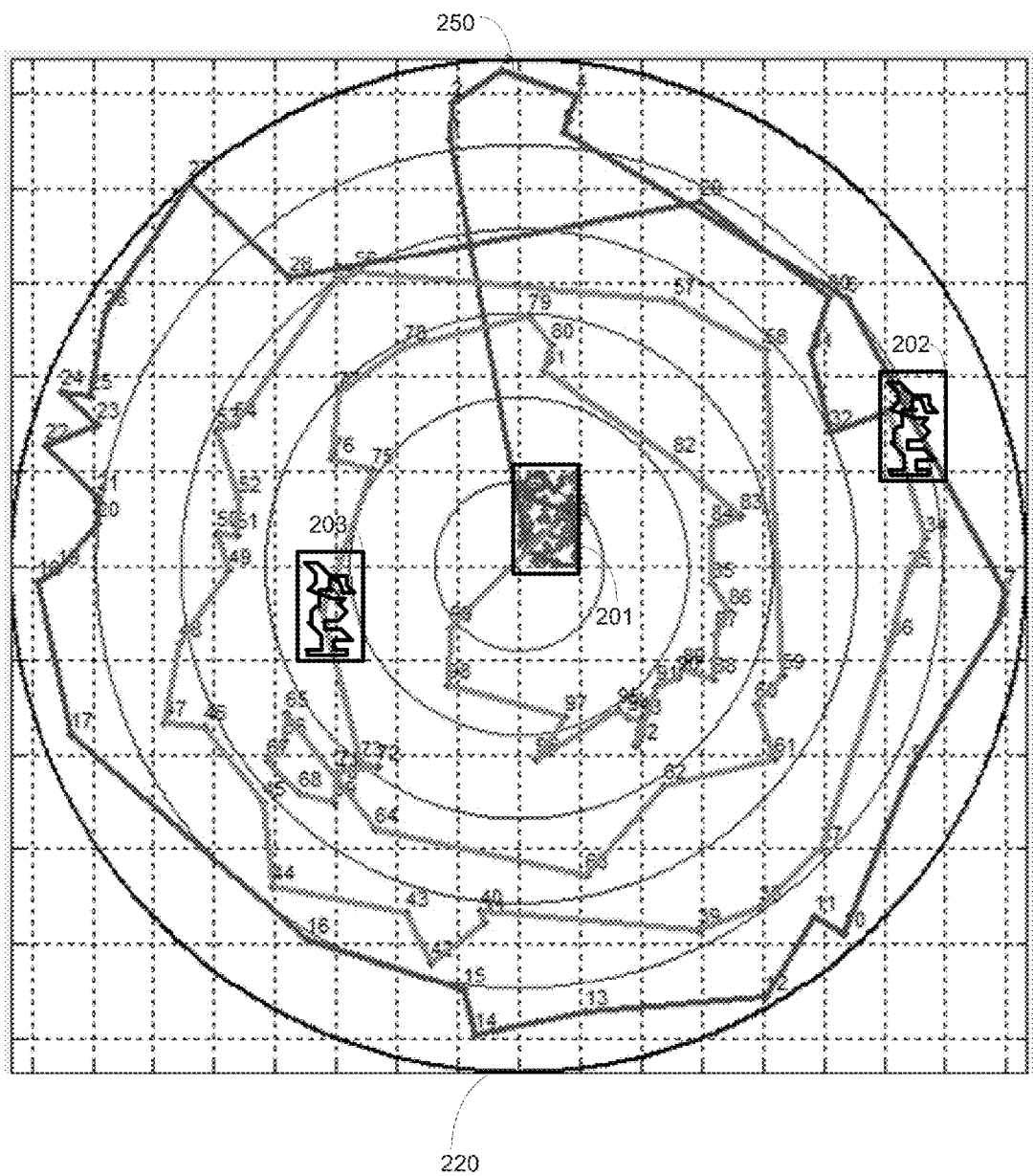
FIG. 4 illustrates a wafer and a scan pattern according to an embodiment of the invention.

In FIGS. 3 and 4 the group of dice that includes dies that have suspected defect includes almost all the dice of wafer 220. Dice are represented in FIGS. 3 and 4 by dashed rectangles. It is noted that the group of dies include between two dice and all the dice of a wafer.

During the review process of the one hundred defects the selection of the first reference die 201 was evaluated and was maintained.

Inter-die mechanical movements are shorter than intra-die mechanical movements and the scan pattern 240 of FIG. 3 achieved a mechanical scan period of 34 seconds—which is 10 seconds faster than the mechanical scan period that was achieved using scan pattern 230 of FIG. 2.

In yet other simulations that compared the first and second tradeoffs a throughput gain of 1.5 was obtained.

FIG. 4 illustrates wafer 220 and a scan pattern 250 that includes ninety nine movements between one hundred stops (denoted 1-100) that represent suspected defects that belong to multiple dice as well as one hundred mechanical movements within first reference die 201, multiple movements within second reference die 202 and multiple movements within third reference die 203.

Second reference die 202 is selected after reviewing thirty three suspected defects denoted 1-33 (and there are sixty seven remaining suspected defects). The thirty three suspected defects (1-33) may form a first sub-set of suspected defects and the thirty three reference elements that were compared to the thirty three suspected defects may be a first sub-set of reference elements.

Third reference die 203 is selected after reviewing seventy four suspected defects (and there are thirty six remaining suspected defects 75-100) denoted 34-74. Third reference die 203 was selected forty one suspected defects after the selection of second reference die 202.

The forty one suspected defects (34-74) may form a second sub-set of suspected defects and the forty one reference elements that were compared to the forty one suspected defects may be a second sub-set of reference elements.

The thirty six suspected defects (75-100) may form a third sub-set of suspected defects and the thirty six reference elements that were compared to the thirty six suspected defects may be a third sub-set of reference elements.

It is noted that second reference die 202 and third reference die 203 represent replacements of reference dies and that the system 300 may have performed evaluations of the reference dies that did not result in a change of reference dies. Hence—the one hundred suspected defects may include more than three sub-sets of suspected defects.

According to an embodiment of the invention, system 300 may obtain in one of more reference die, an amount of reference elements that equals a number of the remaining (not reviewed yet) suspected defects.

Thus, system 300 may obtain images of one hundred reference elements from first reference die 201, may obtain images of sixty seven reference elements at second reference die 202 and/or may obtain thirty six reference elements at third reference die 203.

Yet according to another embodiment of the invention the system 300 may obtain in one of more reference die, an amount of reference elements that is smaller than the number of the remaining (not reviewed yet) suspected defects. This embodiment may be applied when system 300 estimates that a certain reference die will not be able to provide reliable reference elements till the end of the review process.

This estimation may be responsive to information about process variations of wafer 220 that is provided to system 300 and/or calculated by the system.

This estimation may be responsive to the success or failure of one or more previously selected reference die to provide reliable reference elements.

For example—the selection of second reference die 202 after reviewing only thirty three suspected defects may indicate that the second reference die 202 will not be able to provide reliable results for the rest sixty three suspected defects and system 300 may select to obtain fewer than sixty seven reference elements from second reference die 202.

Figure 5:
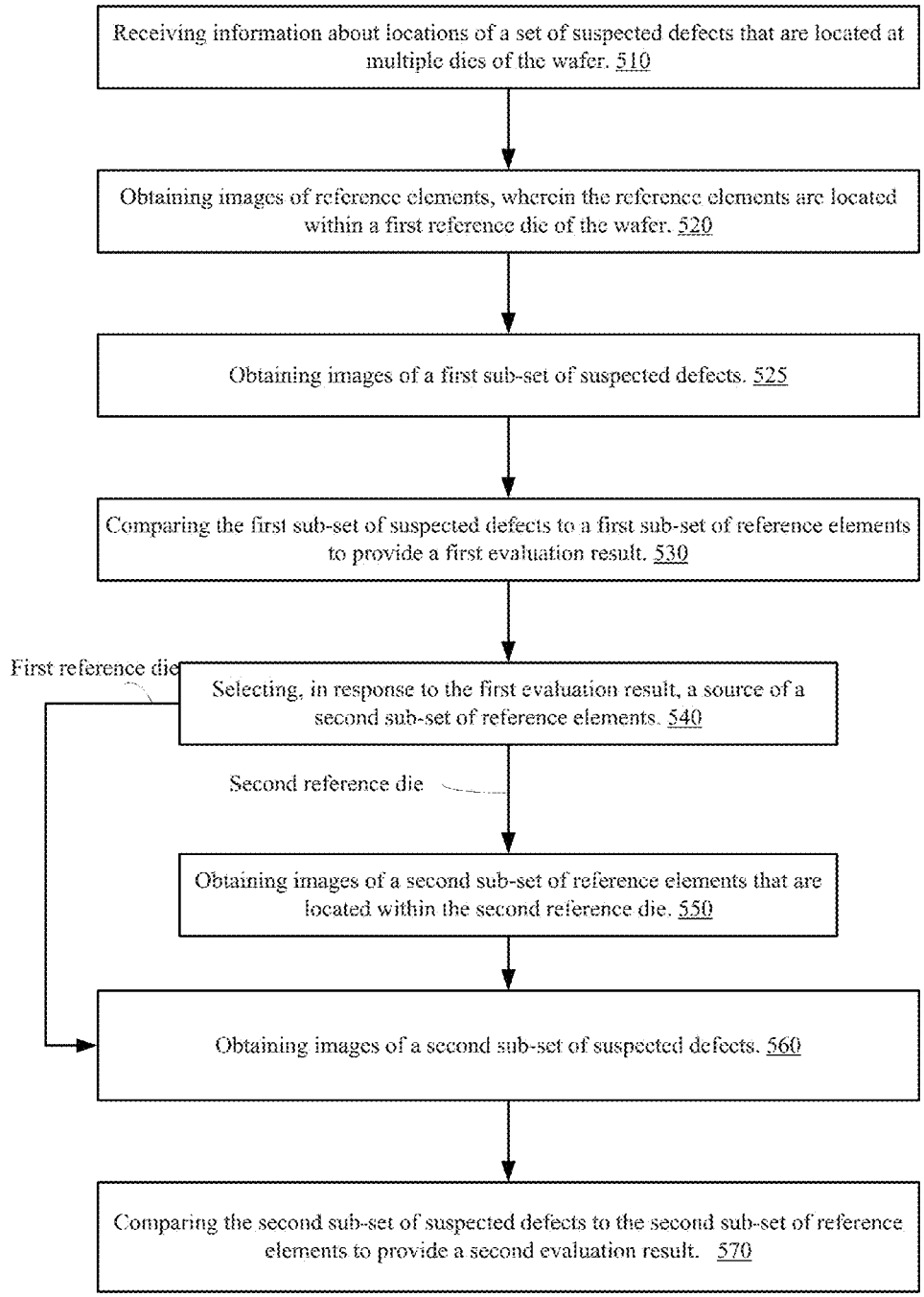
FIG. 5 illustrates a method according to an embodiment of the invention.

FIG. 5 illustrates method 500 for reviewing a wafer, according to an embodiment of the invention.

Method 500 is an iterative method. During each iteration a sub-set of suspected defects is selected, the sub-set of suspected defects is evaluated by a comparison with a sub-set of reference elements and the source of a next sub-set of reference elements is selected.

According to an embodiment of the invention one or more sub-set of suspected defects may include a predefined number of suspected defects.

According to an embodiment of the invention the spatial distribution of suspected defects one or more sub-set of defects may be determined in response to an actual or expected level of process variation. For example—smaller sub-sets of defects or sub-sets of defects of smaller spatial distribution may be selected for wafers that are expected to have a higher process variation level.

Method 500 starts by step 510 of receiving information about locations of a set of suspected defects that are located at multiple dice of the wafer.

Step 510 may be followed by step 520 of obtaining images of reference elements, wherein the reference elements are located within a first reference die of the wafer.

Step 520 may be followed by step 525 of obtaining images of a first sub-set of suspected defects.

Step 525 may be followed by step 530 of comparing the first sub-set of suspected defects to a first sub-set of reference elements to provide a first evaluation result. The first evaluation result may indicate, for example, which suspected defects (of the first sub-set of defects) are actual defects and which suspected defects (of the first sub-set of defects) are not actual defects.

Step 530 may be followed by step 540 of selecting, in response to the first evaluation result, a source of a second sub-set of reference elements.

The selecting may be responsive to a mismatch between the first sub-set of suspected defects to a first sub-set of reference elements. If, for example, the mismatch exceeds a mismatch threshold then the first reference die will not be selected as the source of the second sub-set of reference elements.

The first evaluation result may include a classification of the first sub-set of suspected defects and the selecting of the source may be responsive to the classification of the first sub-set of suspected defects. If, for example, there are defect types that are more sensitive to process variations then there may be a tendency to select a new reference die.

If it is determined that the source of the second sub-set of reference elements is the first reference die than step 540 is followed by step 560.

If it is determined that the source of the second sub-set of reference elements should be a second reference die the step 540 is followed by step 550 of obtaining images of a second sub-set of reference elements that are located within the second reference die. The second reference dice differ from the first reference die. Step 550 is followed by step 560.

Step 560 may include obtaining images of a second sub-set of suspected defects.

Step 560 may be followed by step 570 of comparing the second sub-set of suspected defects to the second sub-set of reference elements to provide a second evaluation result. The second evaluation result may indicate, for example, which suspected defects (of the second sub-set of defects) are actual defects and which suspected defects (of the second sub-set of defects) are not actual defects.

Yet according to another embodiment of the invention instead of initially selecting a single reference die and evaluating the selection during the review process, there may be provided a method that may select one or more reference dice before executing the review process.

Figure 6:
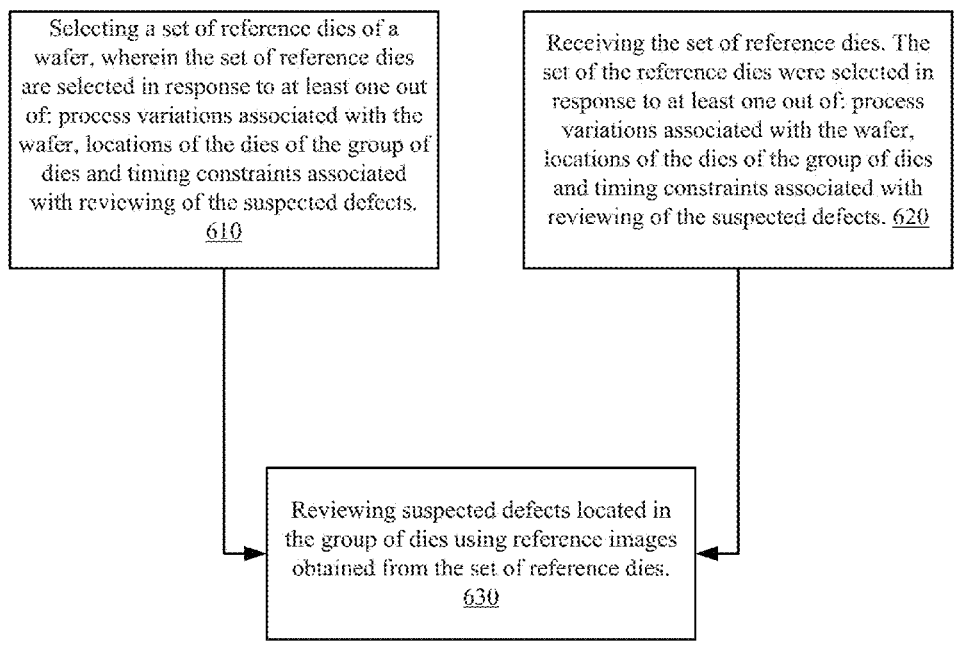
FIG. 6 illustrates a method according to an embodiment of the invention.

FIG. 6 illustrates method 600 for reviewing a wafer, according to an embodiment of the invention.

Method 600 reviews suspected defects that are located within a group of dice of the wafer. The review utilizes reference elements included in a set of reference dice of the wafer. The set of reference dice includes one or more reference dice. The set of reference dice includes fewer dice than the group of dice.

Method 600 may start by steps 610 or 620.

Step 610 includes selecting a set of reference dice of a wafer, wherein the set of reference dice are selected in response to at least one out of: (a) Process variations associated with the wafer; (b) Locations of the dice of the group of dice, and (c) Timing constraints associated with reviewing of the suspected defects.

Wafers of higher process variations may require more reference dice. If the distribution of process variations over the wafer is known (or can be estimated) then the location of the reference dice may be selected in response to the distribution—so that despite the process variation the set of reference dice may provide reliable reference elements throughout the wafer.

The locations of the dice of the group of dice are taken into account so that each die of the group of dice may have a reliable reference die. A More rigid timing constraints may reduce the number of reference dice.

Step 610 may include selecting the reference dice to minimize the duration of the reviewing of the suspected defects while maintaining at least a predefined quality level of the reviewing of the suspected defects. The selection of the set of reference dice may include selecting the number of reference dice and their locations.

Referring to the example of FIG. 3, when it is determined that the predefined quality can be achieved when using a single reference die (such as first reference die 201) then step 610 may include selecting only first reference die 201.

Referring to the example of FIG. 4, when it is determined that the predefined quality can be achieved when using three single reference dice (such as first reference die 201, second reference die 202 and third reference die 203) then step 610 may include selecting first reference die 201, second reference die 202 and third reference die 203.

Step 620 includes receiving the set of reference dice. The set of the reference dice were selected in response to at least one out of: (a) Process variations associated with the wafer, (b) Locations of the dice of the group of dice, and (c) Timing constraints associated with reviewing of the suspected defects.

Steps 610 and 620 may be followed by step 630 of reviewing suspected defects located in the group of dice using reference images obtained from the set of reference dice.

It is noted that step 630 of reviewing may include evaluating the reference dice and selecting a new reference die—as illustrated in method 500.

In the foregoing specification, the invention has been described with reference to specific examples of embodiments of the invention. It will, however, be evident that various modifications and changes may be made therein without departing from the broader spirit and scope of the invention as set forth in the appended claims.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Furthermore, the terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures may be implemented which achieve the same functionality.

Any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A system for reviewing a wafer, the system comprising:
   a memory unit configured to store information about locations of a set of suspected defects that are located at multiple dice of the wafer;
   electron optics configured to obtain images of reference elements located within a first reference die of the wafer;
   a processor configured to:
   compare a first sub-set of suspected defects to a first sub-set of reference elements to provide a first evaluation result; and
   select, in response to the first evaluation result, a source of a second sub-set of reference elements;
   wherein the electron optics are further configured to obtain images of a second sub-set of reference elements that are located within a second reference die of the wafer when it is determined that the second reference die is the source of the second sub-set of reference elements; and
   wherein the processor is further configured to compare a second sub-set of suspected defects to the second sub-set of reference elements to provide a second evaluation result.

2. A method for reviewing a wafer, the method comprising:
   receiving information about locations of a set of suspected defects that are located at multiple dice of the wafer;
   obtaining images of reference elements, wherein the reference elements are located within a first reference die of the wafer;
   obtaining images of a first sub-set of suspected defects;
   comparing the first sub-set of suspected defects to a first sub-set of reference elements to provide a first evaluation result;
   selecting, in response to the first evaluation result, a source of a second sub-set of reference elements;
   obtaining images of a second sub-set of reference elements that are located within a second reference die of the wafer when it is determined that the second reference die is the source of the second sub-set of reference elements;
   obtaining images of a second sub-set of suspected defects; and
   comparing the second sub-set of suspected defects to the second sub-set of reference elements to provide a second evaluation result.

3. The method according to claim 2 comprising retrieving images of the second sub-set of reference elements from the images of the reference elements that are located within the first reference die of the wafer when it is determined that the first reference die is the source of the second sub-set of reference elements.

4. The method according to claim 2 comprising selecting first reference die as the source of the second sub-set of reference elements if the first evaluation result is indicative of a mismatch between the first sub-set of suspected defects and the first sub-set of reference elements; and wherein the mismatch exceeds a mismatch threshold.

5. The method according to claim 2 wherein the first evaluation result comprises a classification of the first sub-set of suspected defects; and wherein the selecting of the source is responsive to the classification of the first sub-set of suspected defects.

6. The method according to claim 2 wherein the second sub-set of suspected defects belongs to dice that are positioned at a same distance from the first reference die.

7. The method according to claim 2 wherein the first sub-set of suspected defects comprises a predetermined number of suspected defects.

8. The method according to claim 2 comprising determining a spatial distribution of the first sub-set of suspected defects in response to an actual or expected level of process variation.

9. A non-transitory computer readable medium that stores instructions that once executed by a computer cause the computer to:
receive information about locations of a set of suspected defects that are located at multiple dice of a wafer;
obtain images of reference elements, wherein the reference elements are located within a first reference die of the wafer;
obtain images of a first sub-set of suspected defects;
compare the first sub-set of suspected defects to a first sub-set of reference elements to provide a first evaluation result;
select, in response to the first evaluation result, a source of a second sub-set of reference elements;
obtain images of a second sub-set of reference elements that are located within a second reference die of the wafer when it is determined that the second reference die is the source of the second sub-set of reference elements;
obtain images of a second sub-set of suspected defects; and
compare the second sub-set of suspected defects to the second sub-set of reference elements to provide a second evaluation result.

10. A method for reviewing a wafer, the method comprising:
receiving or selecting a set of reference dice of a wafer, wherein the set of reference dice is selected in response to at least one out of: process variations associated with the wafer, deviations between review results related to different dice of a group of dice of the wafer, locations of the dice of the group of dice, and timing constraints associated with reviewing of suspected defects that are located in a group of dice of the wafer; and
reviewing the suspected defects using reference images obtained from the set of reference dice; and wherein the set of reference dice comprises fewer dice than the group of dice.

11. The method according to claim 10 wherein the set of reference dice has a single reference die.

12. The method according to claim 10 comprising selecting the reference dice of the set of reference dice.

13. The method according to claim 10 comprising selecting the reference dice to minimize a duration of the reviewing of the suspected defects while maintaining at least a predefined quality level of the reviewing of the suspected defects.

14. A non-transitory computer readable medium that stores instructions that once executed by a computer cause the computer to:
receive or select a set of reference dice of a wafer, wherein the set of reference dice is selected in response to at least one out of: process variations associated with the wafer;
deviations between review results related to different dice of a group of dice of the wafer, locations of the dice of the group of dice, and timing constraints associated with reviewing of suspected defects that are located in a group of dice of the wafer; and
reviewing the suspected defects using reference images obtained from the set of reference dice;
wherein the set of reference dice comprises fewer dice than the group of dice.

15. A system for reviewing a wafer, the system comprising:
a processor that is configured receive or select a set of reference dice of a wafer, wherein the set of reference dice is selected in response to at least one out of: process variations associated with the wafer, deviations between review results related to different dice of a group of dice of the wafer, locations of the dice of the group of dice, and timing constraints associated with reviewing of suspected defects that are located in a group of dice of the wafer; and
electron optics that is configured to obtain reference images obtained from the set of reference dice;
wherein the processor is further configured to review the suspected defects using the reference images obtained from the set of reference dice; and
wherein the set of reference dice comprises fewer dice than the group of dice.

* * * * *